(12) United States Patent
Takeuchi

(10) Patent No.: US 6,566,896 B2
(45) Date of Patent: May 20, 2003

(54) SEMICONDUCTOR TESTING APPARATUS

(75) Inventor: Nobuaki Takeuchi, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 4 days.

(21) Appl. No.: 09/911,843

(22) Filed: Jul. 24, 2001

(65) Prior Publication Data

US 2002/0043979 A1 Apr. 18, 2002

(30) Foreign Application Priority Data

Jul. 26, 2000 (JP) ........................................ 2000-225861

(51) Int. Cl.$^7$ ............................................ G01R 31/302
(52) U.S. Cl. ...................................... 324/750; 356/369
(58) Field of Search ................................ 324/750–753, 324/765, 71.3, 158.1; 250/550, 559.01; 356/237.2, 237.3, 237.4, 237.5, 364, 369, 606–607

(56) References Cited

U.S. PATENT DOCUMENTS 5,898,477 A * 4/1999 Yoshimura et al. ........... 355/53
6,356,347 B1 * 3/2002 Watanabe et al. ........... 356/369
6,486,952 B2 * 11/2002 Takeuchi ..................... 356/369

OTHER PUBLICATIONS

Mitsuru Shinagawa, Tadao Nagatsuma, Kazuyoshi Matsuhiro and Yasuo Kato, "Handy–Type High–Impedance Probe Based on EOS", Proceedings of 15$^{th}$ Meeting on Lightwave Sensing Technology, Japanese Society of Applied Physics, pp. 123–129, May 31, 1995.

Mitsuru Shinagawa and Tadao Nagatsuma, "Sensitivity Improvement of an Electro–Optic High–Impedance Probe", IEEE Instrumentation and Measurement Technology, pp.865–869, May 20, 1997.

Tadao Nagatsuma, "Measurement of High–Speed Devices and Integrated Circuits Using Electro–Optic Sampling Technique", IEICE Trans, Electron., vol. E76–C, No. 1, pp. 55–63, Jan. 1993.

\* cited by examiner

Primary Examiner—Kamand Cuneo
Assistant Examiner—Minh N. Tang
(74) Attorney, Agent, or Firm—Darby & Darby

(57) ABSTRACT

A semiconductor testing apparatus capable of displaying its measurement results in an easily understandable manner is provided. The apparatus comprises a display section for displaying a measurement result of a change in time of a voltage distribution on a measurement plane of a measured device and an input section for entering parameters for the display of the measurement result. When a measurement time is entered as a parameter, the display section displays the measurement result by means of a three-dimensional graph and a representation in numerals, letters or symbols of the measurement time. The graph shows along its three axes a first coordinate in a first direction on the measurement plane, a second coordinate in a second direction which is perpendicular to the first direction, and a voltage at the measurement time at a position on the measurement plane defined by the first and second coordinates.

14 Claims, 10 Drawing Sheets

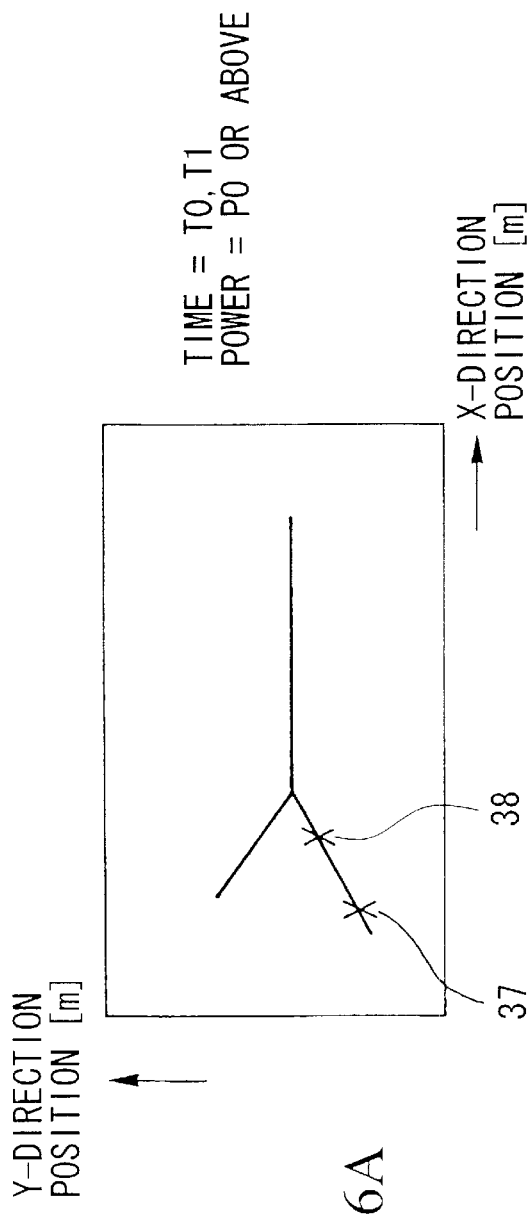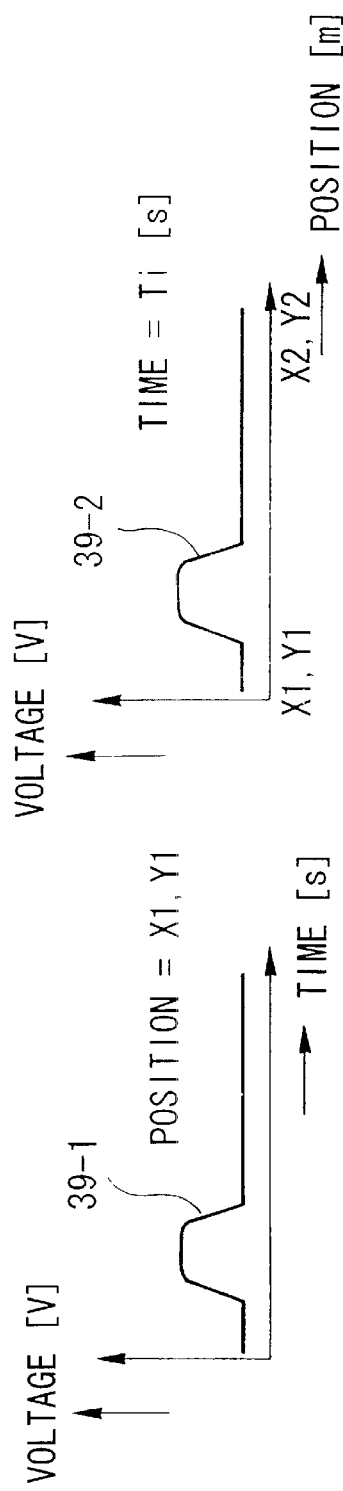
FIG. 6A
FIG. 6B
FIG. 6C

FIG. 7A

FIRST-ORDER REAL-TERM MATRIX (Y AXIS ↑, X AXIS →)

| R11 | R12 | R13 | ··· | R1i | ··· | R1m |
|-----|-----|-----|-----|-----|-----|-----|
| R21 | R22 | R23 | ··· | R2i | ··· | R2m |
| R31 | R32 | R33 | ··· | R3i | ··· | R3m |
| ··· |     |     |     | Rij |     | ··· |
| Rn1 | Rn2 | Rn3 | ··· | Rni | ··· | Rnm |

FIG. 7B

FIRST-ORDER IMAGINARY-TERM MATRIX (Y AXIS ↑, X AXIS →)

| I11 | I12 | I13 | ··· | I1i | ··· | I1m |
|-----|-----|-----|-----|-----|-----|-----|
| I21 | I22 | I23 | ··· | I2i | ··· | I2m |
| I31 | I32 | I33 | ··· | I3i | ··· | I3m |
| ··· |     |     |     | Iij |     | ··· |
| In1 | In2 | In3 | ··· | Ini | ··· | Inm |

SEMICONDUCTOR TESTING APPARATUS

FIELD OF THE INVENTION

This invention relates generally to semiconductor testing apparatuses of the EOS (Electro-Optic Sampling) type for measuring voltages and/or electric fields by making use of the electro-optic effect, and more particularly to such a semiconductor testing apparatus which is capable of carrying out a measurement in terms of one-dimensional distribution and/or simultaneous measurements at a plurality of positions.

DESCRIPTION OF THE RELATED ART

Semiconductor testing apparatuses in the related art include, as an example, one described in an article "Handy-Type High-Impedance Probe Based on EOS" by Shinagawa et al., Fifteenth Meeting on Light-Wave Sensing Technology, pages 123 to 129, 1995.

FIG. 9 shows an improved version of the above-mentioned semiconductor testing apparatus which will be described hereunder. A light source 1 is driven by a light-source drive circuit 17 to emit a laser light. The laser light emitted from the light source 1 is converged by a collecting lens 2 and guided to a curved-surface mirror 3. The laser light reflected by the curved-surface mirror 3 irradiates an electro-optic element 4. The laser light is then reflected by a reflector 5 provided on the lower surface of the electro-optic element 4, and is split by a polarizing beam splitter 8 into two after passing through a wavelength plate 7. The split laser lights are converged by micro-lens arrays 9-1 and 9-2 and are then received by line sensors 10-1 and 10-2, respectively. The path of the laser light is diagrammatically shown by numeral 18 in FIG. 9.

The light source 1, the collecting lens 2 and the curved-surface mirror 3 are arranged so that the laser light irradiates the boundary surface between the electro-optic element 4 and the reflector 5 in a substantially linear manner. More specifically, the arrangement of the light source 1, the collecting lens 2 and the curved-surface mirror 3 is such that the cross section of the laser light beam on the boundary surface between the electro-optic element 4 and the reflector 5 (hereinafter referred to as "measurement plane") is substantially a straight line (hereinafter referred to as a "measurement line").

Each of the micro-lens arrays 9-1 and 9-2 is in the form of a compound lens constituted by a plurality of lenses which are arranged linearly so that the linear or oblong laser light beam can pass through the plurality of lenses.

A variation in voltage in a DUT (device under test) 6, which the measured device, as brought about by an input to or an output from the DUT 6, causes a change in the electric field in the electro-optic element 4 adjoining the DUT 6. The polarization of the laser light passing through the electro-optic element 4 changes depending on the electric field therein. Since the laser light is linear or oblong as described above, the change in polarization caused by the electric field may be different at different positions in the linear or oblong cross-section of the laser light.

The wavelength plate 7 is chosen such that the laser light has an angle of polarization such that the polarizing beam splitter 8 splits the laser light into two substantially equal parts. The splitting ratio of the polarizing beam splitter 8 changes in accordance with the amount of polarization of the incident light, as a result of which the laser light whose polarization has been changed in the electro-optic element 4 is subject to a change in amplitude when passing through the polarizing beam splitter 8.

As described above, a position-dependant change in the voltage in the DUT 6 results in a change in amplitude of the laser light which depends on the position in the cross-section of the beam. The laser light with a changed amplitude passes through the micro-lens arrays 9-1 and 9-2 and is received by the line sensors 10-1 and 10-2, each of which then converts the change in amplitude of the laser light into a change in amplitude of an electric signal. Thus, electric signals which are proportional to the voltages or electric fields at the respective positions on the DUT 6 can be obtained from each of the line sensors 10-1 and 10-2.

Since the changes in amplitude of the split outputs from the polarizing beam splitter 8 are opposite in phase, i.e., when one increases the other decreases, the signal component of the DUT 6 can be obtained more reliably by taking the difference between the output electric signals from the line sensors 10-1 and 10-2.

For the above reason, as shown in FIG. 9, the output signals of the line sensors 10-1 and 10-2 are first amplified by amplifier circuits 11-1 and 11-2, respectively, and then the difference between the two signals is taken by a differential circuit 26. The differential signal thus obtained is sampled and held by a sample-and-hold circuit 12. The output of the sample-and-hold circuit 12 is supplied through a selection circuit 13 to an A/D converter 14, which converts the output into a digital signal which is fed to a calculation/display device 15. The selection circuit 13 has the function of selecting one out of a plurality of signals. A plurality of amplifier circuits amplify the respectively outputs of the plurality of line sensors in a parallel fashion. Specifically, when the amplifier circuit 11-1 amplifies the output signal of the line sensor 10-1, the amplifier circuit 11-2 amplifies the output signal of the line sensor 10-2 at the same time.

The plurality of output signals of the amplifier circuit 11-1 is supplied to a selection circuit 27-1 which in turn selects one of the plurality of output signals. Similarly, the plurality of output signals of the amplifier circuit 11-2 is supplied to the selection circuit 27-2 which selects the one of the plurality of output signals which has been obtained from the same measurement point as the output signal selected by the selection circuit 27-1. The outputs from the selection circuits 27-1 and 27-2 are added together at the summing circuit 28 to obtain the laser-light intensity signal. The output of the summing circuit 28 is input to the selection circuit 13. These circuits are provided not for the purpose of measuring the DUT 6 but for the purpose of obtaining the intensity of the laser light only, so that a sample-and-hold operation and other operations are not necessary.

If the light source 1 emits a pulsed light, the measurement signal obtained from a measuring zone on the DUT 6, i.e., the output signals from the line sensors 10-1 and 10-2, should be a repetitive signal which is synchronized with a trigger signal St. A timing generator 16 generates a pulse light-emission timing signal Sp, whose phase is delayed by δt each time the trigger signal St is received, to make the light source 1 to emit a pulsed light or a light pulse.

The measurement signals at respective measuring points on the DUT 6, which are obtained by directing the light pulse through the collecting lens 2, the curved-surface mirror 3 and the electro-optic element 4 towards the reflector 5 provided on the upper surface of the DUT 6 to irradiate it, are sampled and held at the same time by the sample-and-hold circuit 12 in synchronism with a sample-and-hold timing signal Ssh.

N signals output from the sample-and-hold circuit 12 are sequentially selected by the selection circuit 13 in accordance with a selection-circuit timing signal Ssel. The A/D converter 14 sequentially converts the analog signals selected by the selection circuit 13 into digital signals in synchronism with the A/D conversion timing signal Sad. Specifically, the N signals as obtained by a single sample-and-hold operation are sequentially A/D converted. By repeating the above operation, results of all the measurements of voltages or electric fields of the DUT 6 can be obtained.

The calculation/display device 15 converts the digital data obtained at the A/D converter 14 into voltages or electric fields at the respective measuring points on the DUT 6 by multiplying the digital data by the sensitivity of the measuring system and displays the voltages or electric fields.

FIG. 10 shows one example of the measurement results which the calculation/display device 15 displays. The example shown corresponds to the case where a voltage distribution on the measurement line of the DUT 6 is displayed as the measurement result. The measurement position is displayed along the horizontal axis in the display area and the voltage values obtained as the measurement results are shown on the vertical axis, whereby a graph showing the relation between the positions and the voltages, i.e., a voltage distribution representation 41, is displayed. In this manner, the relation between the measurement positions and the measured values can be displayed.

If a voltage pulse or electric field pulse moves within the DUT 6, the direction of travel of the voltage or electric-field pulse can be obtained from the change in time of the waveform measured from the DUT 6 and displayed on the calculation/display device 15. FIG. 11 is an example of such a display wherein a waveform representing a voltage distribution is displayed in the display area with the horizontal axis representing the position and the vertical axis representing the voltage. The direction in which each portion is moving is indicated by the traveling direction indications 44 and 45. In this example, the waveform 42 corresponding to the traveling direction indication 44 is shown by a solid line, while the waveform 43 corresponding to the traveling direction indication 45 is shown with a dotted line.

The above-described apparatus in the related art, however, has the following problems. In the measurement results, the voltage distribution in the two-dimensional measurement plane varies with the lapse of time. In other words, a total of four-dimensional axes, namely, two coordinate axes for displaying positions two-dimensionally, a voltage axis and a time axis, are necessary to display the measurement results. However, according to the measuring apparatus in the related art, only two dimensions can be displayed at the same time, and thus it has been impossible to display the measurement results in a sufficiently easily understandable manner. Since the display is thus not easy to understand, it has also been troublesome to operate the measuring apparatus based on the display. Furthermore, it has been impossible to display the direction of movement of the voltage two-dimensionally. Also, it has been impossible to display an energy distribution on the measurement plane (on the two-dimensional plane) as the objective measurement region.

SUMMARY OF THE INVENTION

The present invention is to solve the above problems and has an object to provide a semiconductor testing apparatus which can display measurement results in an easily understandable manner.

A semiconductor testing apparatus according to the present invention comprises a measuring section for measuring a change in time of an electric field distribution, a voltage distribution or a current distribution in a measured device, on a desired plane thereof; a display section for displaying a result of measurement on the desired plane of the change in time of the electric field distribution, the voltage distribution or the current distribution of the measured device; and an input section for entering parameters for the display of the result of measurement on the display section; wherein, when an arbitrary measurement time is entered through the input section as a parameter, the display section displays the result of measurement by means of a three-dimensional graph and a representation in numerals, letters or symbols of the measurement time entered through the input section, the three-dimensional graph showing along its three axes a first coordinate in a first direction on the measurement plane of the measured device, a second coordinate in a second direction which is perpendicular to the first direction on the measurement plane, and a voltage at the measurement time entered through the input section at a position on the measurement plane defined by the first and second coordinates.

The measurement results obtained by the semiconductor testing apparatus at the respective measurement times, i.e., the voltage distribution on the measurement plane of the DUT, can thus be displayed on a three-dimensional graph in an easily understandable manner, so that the user of the semiconductor testing apparatus can recognize the measurement results (the voltage distribution on the measurement plane) quite easily.

For example, the display section can display the X-direction position, the Y-direction position and the voltage at an arbitrary measurement time as three-dimensional graphics. In addition, the measurement time to be displayed on the display section can be freely set through the input section.

A semiconductor testing apparatus according to another aspect of the invention comprises a measuring section for measuring a change in time of an electric field distribution, a voltage distribution or a current distribution in a measured device, on a desired plane thereof; a display section for displaying a result of measurement on the desired plane of the change in time of the electric field distribution, the voltage distribution or the current distribution of the measured device; and an input section for entering parameters for the display of the result of measurement on the display section; wherein, when a first coordinate in a first direction on the measurement plane of the measured device or a second coordinate in a second direction which is perpendicular to the first direction on the measurement plane is entered through the input section as a parameter, the display section displays the result of measurement by means of a three-dimensional graph and a representation in numerals, letters or symbols of the first coordinate or the second coordinate entered through the input section, the three-dimensional graph showing along its three axes whichever of the first and second coordinates has not been entered through the input section, a measurement time, and a voltage at a position on the measurement plane defined by the first and second coordinates.

The measurement results obtained by this semiconductor testing apparatus, i.e., the change in time of the voltage (a voltage waveform) on the measurement plane (on a predetermined measurement line) of the DUT, can thus be displayed on the three-dimensional graph in a more easily understandable manner, so that the user of the semiconductor testing apparatus can recognize the measurement results (the change with the lapse of time) quite easily.

For example, the display section can display the Y-direction position, the measurement time and the voltage at an arbitrary X-direction position on the measurement plane as a three-dimensional graphics while the X-direction position can freely be set through the input section. Also, the display section can display the X-direction position, the measurement time and the voltage at an arbitrary Y-direction position on the measurement plane as a three-dimensional graphics, while the Y-direction position can freely be set through the input section.

In the present invention, the display section may be arranged to display two kinds of cursor lines which extend along an X axis representing the X-direction position and a Y axis representing the Y-direction position, respectively, and move over the waveforms displayed as three-dimensional graphics, wherein each cursor line may be movable to an arbitrary position by an input through the input section. A freely movable cursor can thus be displayed on the three-dimensional graph and the measurement values at the cursor position can easily be read out, so that the user can read out any desired measurement value quite easily.

The display section may display the data designated by the cursor line in the form of a two-dimensional graphic representing the position and the voltage. Thus, the parameters at the position of the cursor can easily be read out, so that the user can recognize the parameters at the cursor position easily. For example, the parameters at an arbitrary point on the three-dimensional graph can be displayed, the user can easily see the parameters at an arbitrary point on the three-dimensional graph.

In the present invention, the display section may be arranged to display a point cursor which moves over the waveforms displayed as three-dimensional graphics, wherein the point cursor may be movable to an arbitrary point by an input through the input section. Also, the display section may be arranged to perform a two-dimensional graphics display of the voltage at the point designated by the point cursor and the time.

In the present invention, the power distribution on the measurement plane of the DUT and the distribution of power peaks may be displayed. According to such an arrangement, the user can obtain a variety of information about the DUT.

In the present invention, the display section may be arranged to display markers for designating two arbitrary points on the measurement plane (a two-dimensional plane) so that the direction of movement of the voltage waveform between the two points can be obtained. In order to determine the direction of movement, a Fourier transform is carried out at each of the two points. A matrix of real-term coefficients and imaginary-term coefficients of the first-order frequency components at the two points is obtained, and it is then determined for the adjoining two points at each position that the voltage waveform moves from a greater real-term coefficient side to a smaller real-term coefficient side when the imaginary-term coefficients are positive for the two points, from the smaller real-term coefficient side to the greater real-term coefficient side when the imaginary-term coefficients are negative for the two points, and from a positive imaginary-term coefficient side to a negative imaginary-term coefficient side when the imaginary-term coefficients are positive and negative.

The above determination may be performed for each point on the measurement plane (two-dimensional plane) to obtain a distribution of directions of movement of the voltage waveforms on the two-dimensional plane. In this case, the display section may be arranged to display, by means of vectors, the directions of movement of the voltage waveforms and the power distribution on the two-dimensional plane. More specifically, the vectors can be displayed two-dimensionally with arrows, wherein the magnitude of each vector can be expressed based on the length, the thickness, the color or the like of the arrow. In addition, a threshold may be provided for the power distribution so that the arrows are displayed only at each of those locations where the corresponding power is greater than this threshold.

In this manner, the directions of movement of the voltage waveforms (the directions of movement of the signals) and the amounts of movement of the voltage waveforms can be displayed on a two-dimensional graph representing the measurement plane, so that the user can recognize the directions and the amounts of movement of the voltage waveforms quite easily.

BRIEF DESCRIPTION OF THE DRAWINGS

FIG. 6A is an illustration showing an example displayed in the first embodiment, wherein the power distribution is displayed on the screen of the calculation/display device 15;

FIG. 6B is an illustration showing an example displayed in the first embodiment, wherein the change in time of the voltage at the position of first marker 37 shown in FIG. 6A is displayed in the form of a two-dimensional graph;

FIG. 6C is an illustration showing an example displayed in the first embodiment, wherein the voltage distribution between the first marker 37 and the second marker 38 shown in FIG. 6A is displayed in the form of a two-dimensional graph;

FIG. 7A is an illustration showing a matrix of real number terms of the first-order frequency components at respective points on the measurement plane in the first embodiment;

FIG. 7B is an illustration showing a matrix of imaginary number terms of the first-order frequency components at respective points on the measurement plane in the first embodiment;

DETAILED DESCRIPTION OF THE PREFERRED EMBODIMENTS

Figure 1:
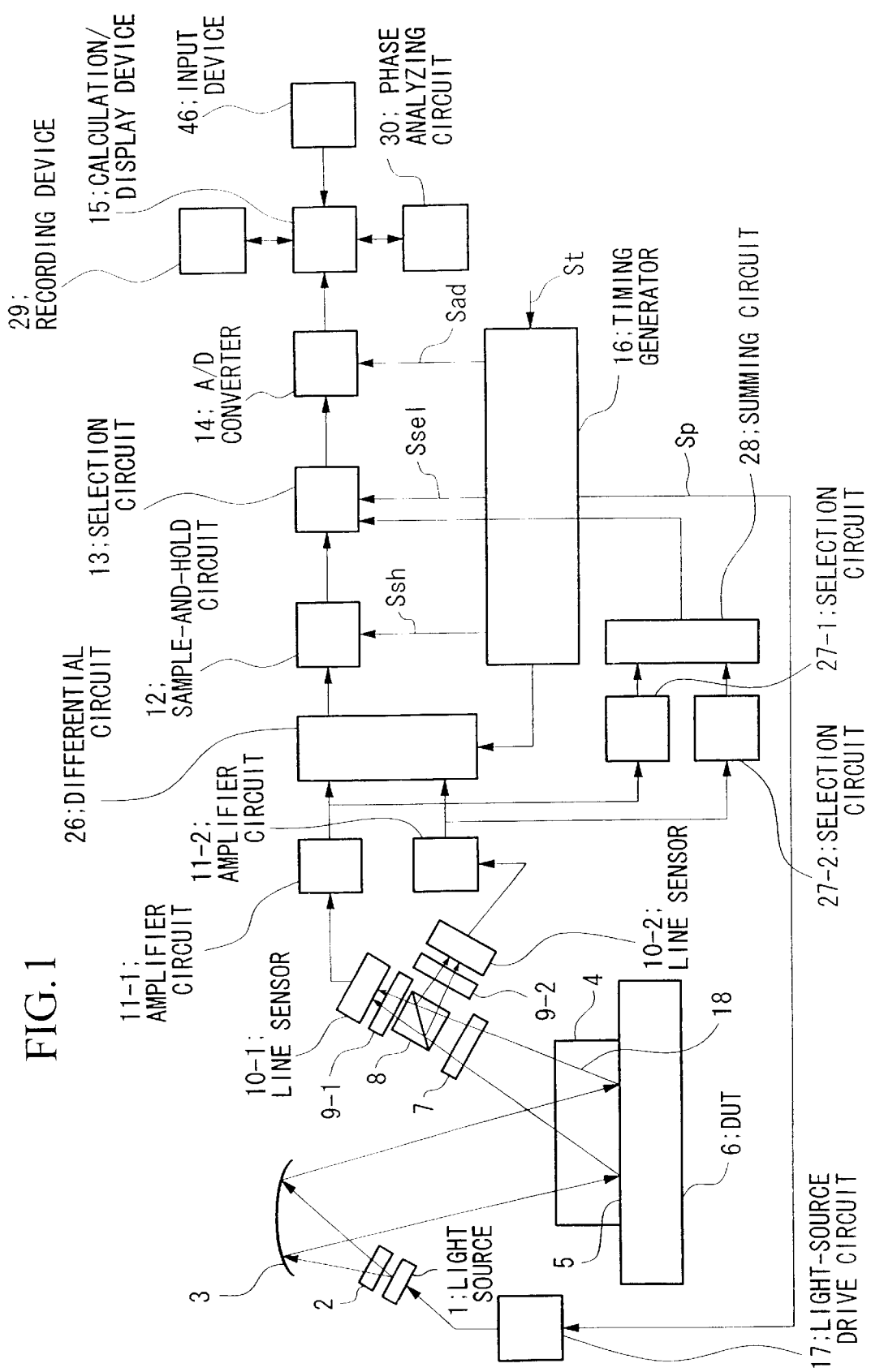
FIG. 1 is a block diagram of a semiconductor testing apparatus provided in accordance with a first embodiment of the invention.

FIG. 1 is a block diagram of a semiconductor testing apparatus provided in accordance with a first embodiment of the present invention. The structure of the semiconductor testing apparatus according to this embodiment will be described hereinafter with reference to FIG. 1. A light source 1 is driven by a light-source drive circuit 17 to emit a laser light. The laser light emitted from the light source 1 is converged by a collecting lens 2 and directed onto a curved-surface mirror 3. The laser light reflected by the curved-surface mirror 3 irradiates the electro-optic element 4. The laser light is then reflected by a reflector 5 provided on the lower surface of the electro-optic element 4, and is split by a polarizing beam splitter 8 into two after passing through a wavelength plate 7. The split laser beams are converged by micro-lens arrays 9-1 and 9-2 and then received by line sensors 10-1 and 10-2, respectively. The path of the laser light is diagrammatically shown by numeral 18 in FIG. 1.

The light source 1, the collecting lens 2 and the curved-surface mirror 3 are arranged so that the laser beam irradiating the boundary surface between the electro-optic element 4 and the reflector 5 is substantially linear. More specifically, the arrangement of the light source 1, the collecting lens 2 and the curved-surface mirror 3 is such that the cross section of the laser beam on the boundary surface between the electro-optic element 4 and the reflector 5 (hereinafter referred to as "measurement plane") is a substantially straight line (hereinafter referred to as "measurement line").

Each of the micro-lens arrays 9-1 and 9-2 is in the form of a compound lens constituted of a plurality of lenses which are arranged linearly so that the linear or oblong laser light beam can pass through the plurality of lenses.

A variation of voltage in a DUT 6, which is the measured device, as brought about by an input to or an output from the DUT 6 causes a change in the electric field in the electro-optic element 4 adjoining the DUT 6. The laser light passing through the electro-optic element 4 is subjected to the effect of the change in electric field and changes its polarization. Since the laser light takes a linear or oblong shape as described above, the change in polarization caused by the electric field is different in amount at different positions on the linear or oblong cross-section of the laser light.

The wavelength plate 7 is selected such that the laser light has a polarizing angle which will make the polarization beam splitter 8 split the laser light into two substantially equal parts. The splitting ratio of the polarizing beam splitter 8 has characteristic changes in accordance with the amount of polarization of the incident light, as a result of which the laser light which has had its polarization changed in the electro-optic element 4 has its amplitude changed when passing through the polarizing beam splitter 8.

Thus, position-dependant changes in voltage in the DUT 6 result in changes in amplitude of the laser light which depend on the positions in the cross-section of the beam thereof. The laser light, after its amplitude is changed, passes through the micro-lens arrays 9-1 and 9-2 and is received by the line sensors 10-1 and 10-2, each of which then converts the change in amplitude of the relevant laser light into a change in amplitude of an electric signal. Thus, electric signals proportional to the voltages or electric fields at respective positions on the DUT 6 can be obtained from the line sensors 10-1 and 10-2.

Since the changes in amplitude of the split outputs from the polarizing beam splitter 8 are opposite in phase, i.e., when one of them increases the other decreases, the signal component of the DUT 6 can be obtained more reliably by taking the difference between the output electric signals from the line sensors 10-1 and 10-2.

For this reason, as shown in FIG. 1, the output signals of the line sensors 10-1 and 10-2 are first amplified by amplifier circuits 11-1 and 11-2, respectively, and then the difference between the two signals is taken by the differential circuit 26. The differential signal thus obtained is sampled and held by a sample-and-hold circuit 12. An output of the sample-and-hold circuit 12 is supplied through a selection circuit 13 to an A/D converter 14 where it is converted into a digital signal to be fed to a calculation/display device 15. The selection circuit 13 has the function of selecting one of a plurality of signals. Also, a plurality of amplifier circuits respectively amplify outputs from a plurality of line sensors in a parallel fashion. Specifically, when the amplifier circuit 11-1 amplifies the output signal of the line sensor 10-1, the amplifier circuit 11-2 amplifies the output signal of the line sensor 10-2 at the same time.

The plurality of output signals of the amplifier circuit 11-1 are supplied to the selection circuit 27-1 which in turn selects one of the plurality of output signals. Similarly, the plurality of output signals of the amplifier circuit 11-2 are supplied to a selection circuit 27-2 which selects that one of the plurality of output signals which has been obtained from the same measuring point at which the output signal selected by the selection circuit 27-1 has been obtained. Outputs from the selection circuits 27-1 and 27-2 are added together at a summing circuit 28 to obtain a laser-light intensity signal. The output of the summing circuit 28 is input to the selection circuit 13. These circuits have been provided not for the purpose of measuring the DUT 6 but for the purpose of obtaining the intensity of the laser light only, so that a sample-and-hold operation and other operations are not necessary.

If the light source 1 emits a pulsed light, a measurement signal obtained from a measuring zone on the DUT 6, i.e., the output signals from the line sensors 10-1 and 10-2, should be a repetitive signal which is synchronized with a trigger signal St. A timing generator 16 generates a pulse light-emission timing signal Sp, whose phase is delayed by δt each time the trigger signal St is received, to cause the light source 1 to emit a pulsed light or a light pulse.

Measurement signals at respective measuring points on the DUT 6, which are obtained by directing the light pulse through the collecting lens 2, the curved-surface mirror 3 and the electro-optic element 4 towards the reflector 5 provided on the upper surface of the DUT 6 to thereby irradiate it, are sampled and held at the same time by the sample-and-hold circuit 12 in synchronism with a sample-and-hold timing signal Ssh.

N signals output from the sample-and-hold circuit 12 are sequentially selected by the selection circuit 13 in accordance with a selection-circuit timing signal Ssel. The A/D converter 14 sequentially converts the analog signals selected by the selection circuit 13 into digital signals in synchronism with an A/D conversion timing signal Sad. Specifically, the N signals as obtained by a single sample-and-hold operation are sequentially A/D converted. By repeating the above operation, the results of all the measurements of voltages or electric fields of the DUT 6 can be obtained.

The calculation/display device 15 converts the digital data obtained at the A/D converter 14 into voltages or electric fields at the respective measuring points on the DUT 6 by multiplying the digital data by the sensitivity of the measuring system and displays the converted voltages or electric fields.

An input device 46 is provided for entering, among others, parameters to change the displays of the measurement results and is constituted, for example, by a keyboard and the like.

By carrying out the above measurement, while sweeping the measurement line in the direction perpendicular to the measurement line in the measurement plane by moving the DUT 6 perpendicularly to the measurement line in the measurement plane, a voltage or an electric-field distribution on the measurement plane, i.e., on a two-dimensional plane, can be obtained. In addition, by repeating the above measurement at a predetermined time interval, a change in time of the voltage or the electric field can be obtained. The measurement results thus obtained in the above measurements are recorded in a recording device 29.

A phase analyzing circuit 30 is provided for obtaining the direction of travel of the voltage or the electric-field pulse and is arranged to obtain frequency components at respective positions on the DUT 6 from values measured in accordance with the lapse of time. More specifically, the measured data temporarily recorded in the recording device 29 is supplied to the phase analyzing circuit 30 to calculate frequency components. For example, a Fourier transform can be used in such a calculation. According to this calculation, the phases of the waveforms on the time axis can be known, from which phases the direction of travel of the pulse can be obtained.

The above measurement result contains four parameters composed of two-dimensional positional information with respect to the X and Y axes, representing the measurement position, information representing the voltage measured at a predetermined measurement position and information representing the measurement time. Here, the X and Y axes are coordinates axes provided on a measurement plane to define an arbitrary point on the measurement plane, wherein the X and Y axes intersect each other.

Figure 2:
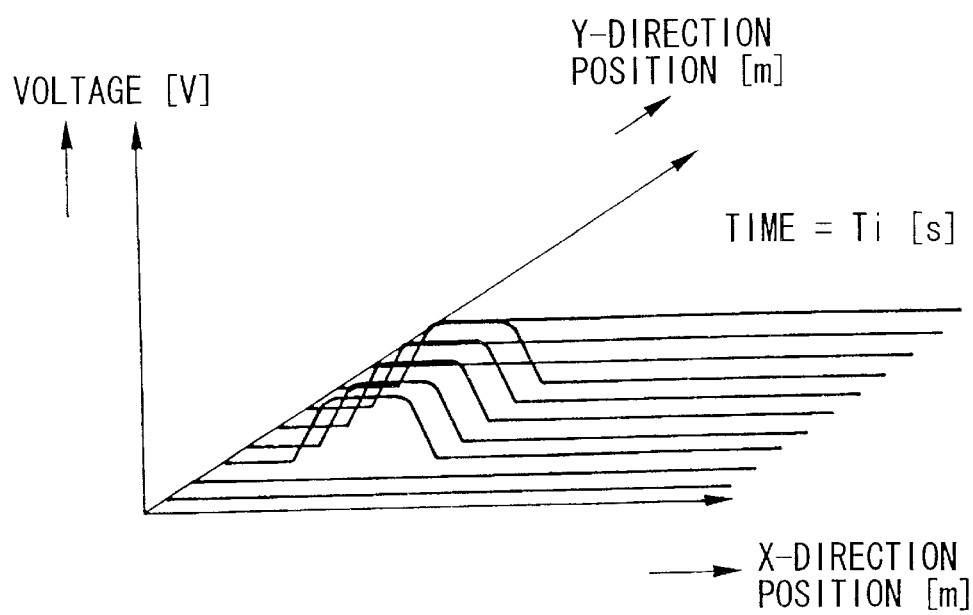
FIG. 2 is an illustration showing, as an example, a graphical display on the calculation/display device 15 in the first embodiment, wherein three parameters are shown three-dimensionally with the time axis being fixed.

First, an example of fixing the time axis and graphically displaying the remaining three-dimensional parameters on the calculation/display device 15 is shown in FIG. 2. More specifically, a three-dimensional graphic (a three-dimensional graph) based on the X-direction position, the Y-direction position and the voltage parameters is displayed on the screen of the calculation/display device 15. In this case, the measurement time of the data in this graph is displayed at the same time in numerals, letters or symbols. The measurement time is entered through the input device 46, in response to which the measurement data at the entered measurement time is read from the recording device 29 and is calculated and displayed at the calculation/display device 15.

Figure 3:
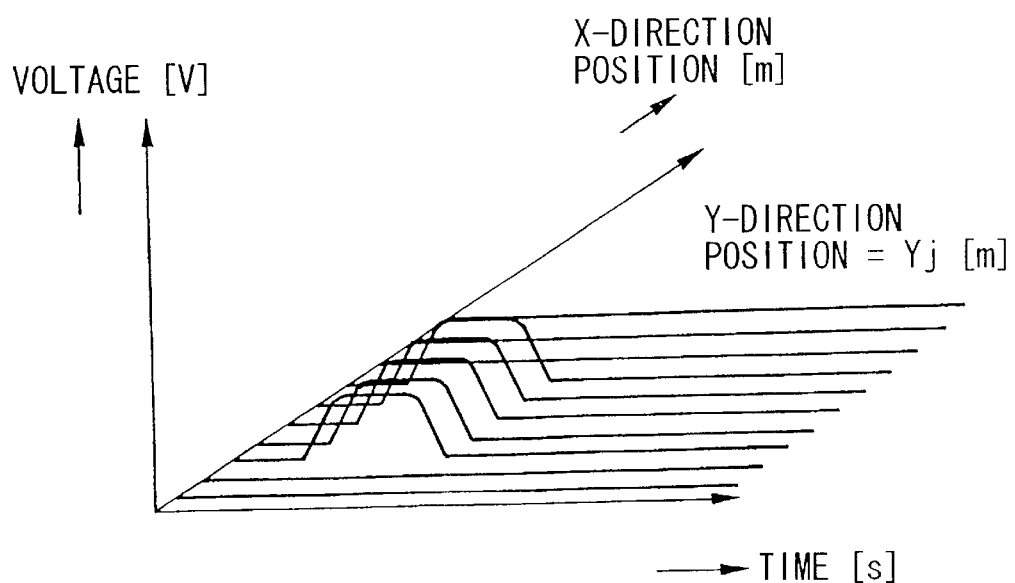
FIG. 3 is an illustration showing, as an example, a graphical display made on the calculation/display device 15 in the first embodiment, wherein three parameters are displayed three-dimensionally with the position in the Y direction being fixed.

Next, an example of fixing the Y-direction position and graphically displaying the remaining three-dimensional parameters on the calculation/display device 15 is shown in FIG. 3. More specifically, a three-dimensional graphic (a three-dimensional graph) based on the X-direction position, the voltage and the measurement time parameters is displayed on the screen of the calculation/display device 15. In this case, the Y-direction position as a fixed value is displayed at the same time. The Y-direction position is entered through the input device 46, in response to which the measurement data at the entered Y-direction position is read from the recording device 29 and is calculated and displayed at the calculation/display device 15. It is also possible, in a similar manner, to fix the X-direction position and to graphically display the remaining three-dimensional parameters (the Y-direction position, the voltage and the measurement time) on the calculation/display device 15.

Figure 4A:
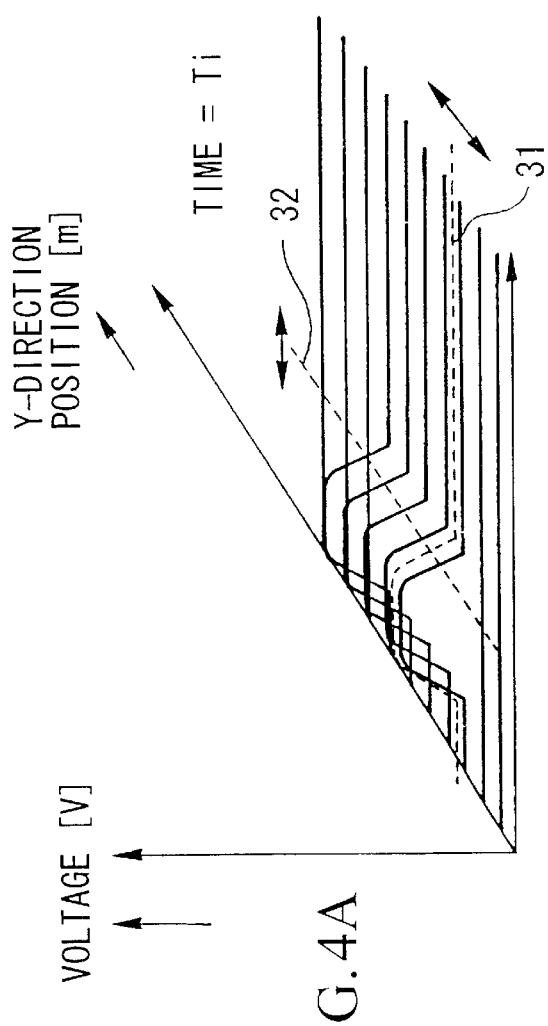
FIG. 4A is an illustration showing an example displayed in the first embodiment, wherein cursor lines parallel to the X and Y axes are additionally displayed over the waveforms displayed on the three-dimensional graph of FIG. 3.

When the calculation/display device 15 shows a three dimensional of the X-direction position, the Y-direction position and the voltage as parameters with the measurement time being fixed, it is possible to display over the displayed waveforms cursor lines in parallel with the X and Y axes, respectively, as shown in FIG. 4A. The position of each cursor line can be moved through the input to the input device 46. More specifically, the X-axis cursor 31 and the Y-axis cursor 32 shown can be moved in the directions indicated by arrows in FIG. 4A, respectively. These arrows are shown for the sake of explanation only and can be omitted from the actual display of the graph.

Figure 4C:
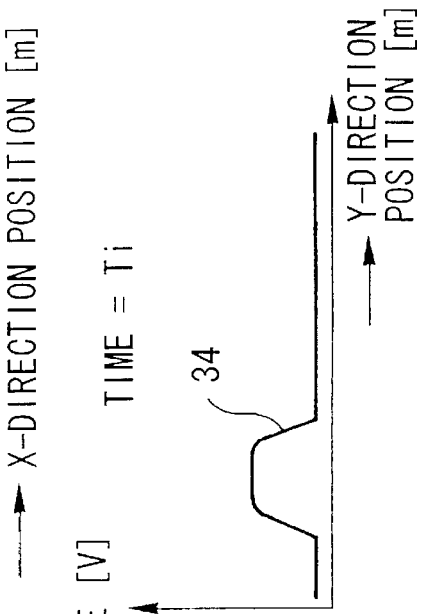
FIG. 4C is an illustration showing an example displayed in the first embodiment, wherein waveform data on the Y-axis cursor is displayed in the form of a two-dimensional voltage distribution graph represented by the Y-direction position and the voltage as parameters.
Figure 4B:
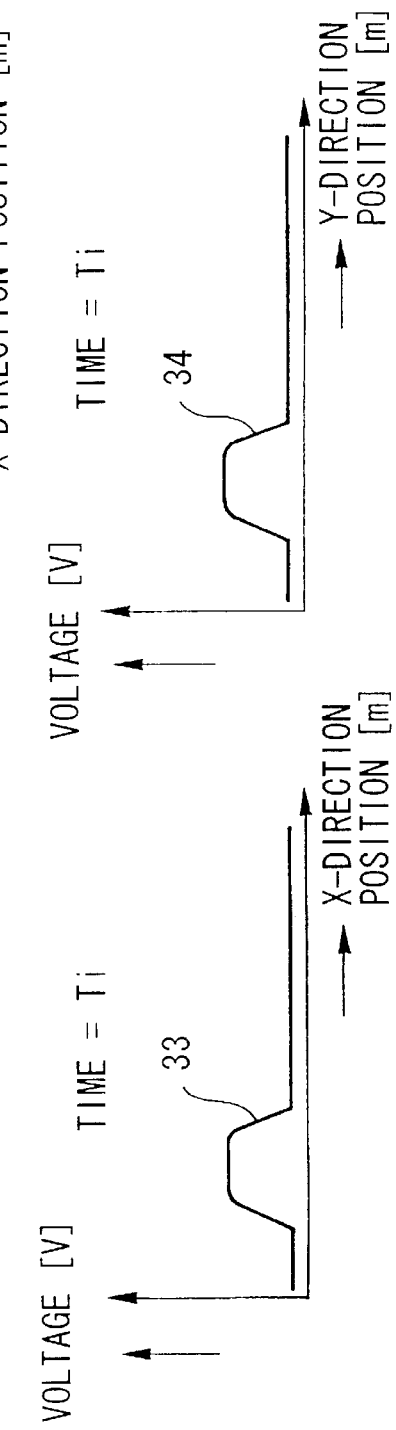
FIG. 4B is an illustration showing an example displayed in the first embodiment, wherein waveform data on the X-axis cursor is displayed in the form of a two-dimensional voltage distribution graph represented by the X-direction position and the voltage as parameters.

Furthermore, the waveform data on the X-axis cursor 31 may be displayed in the form of a two-dimensional graph of voltage distribution (voltage distribution representation 33) based on the X-direction position and the voltage as parameters as shown in FIG. 4B. In a similar manner, the waveform data on the Y-axis cursor 32 may be displayed in the form of a two-dimensional graph of voltage distribution (voltage distribution representation 34) based on the Y-direction position and the voltage as parameters as shown in FIG. 4C.

Figure 5A:
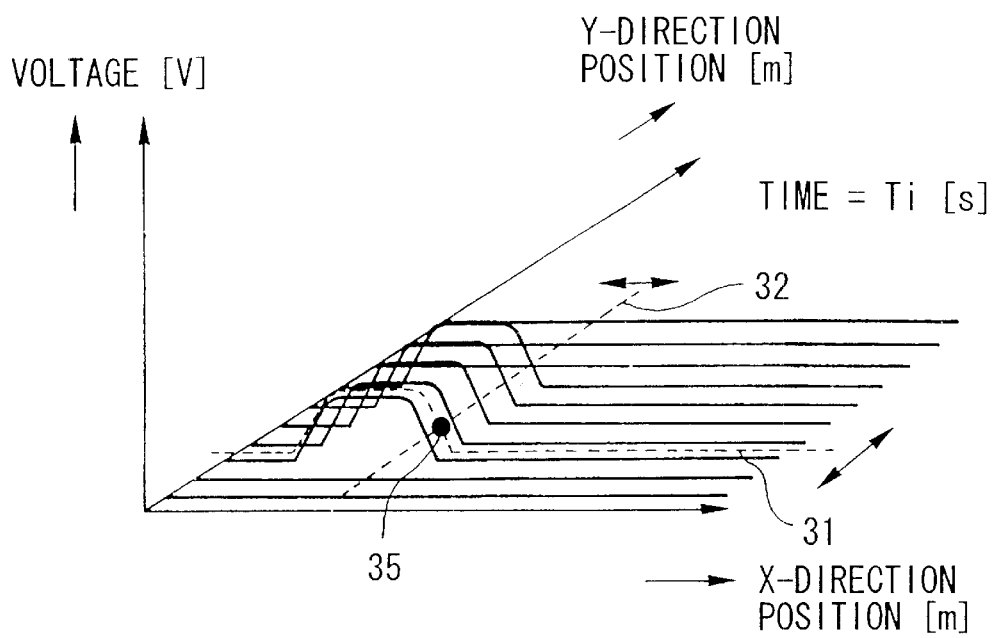
FIG. 5A is an illustration showing an example displayed in the first embodiment, wherein a point cursor 35 is displayed at the intersection of the X-axis cursor 31 and the Y-axis cursor 32 shown in FIG. 4A.

FIG. 5A shows another example in which waveforms are displayed in the form of a three-dimensional graphic (three-dimensional graph) based on the X-direction position, the Y-direction position and the voltage as parameters with the measurement time to be displayed being fixed, over which the X-axis cursor 31 and the Y-axis cursor 32 are displayed with a point cursor 35 being further displayed at the intersection of the two cursors. The X-axis cursor 31 and the Y-axis cursor 32 are the same as those shown in FIG. 4A. Each of these cursors can be moved to a desired position through the input to the input device 46. These three kinds of cursors are arranged such that, when any one of the three cursors is moved through an input to the input device 46, the calculation/display device 15 re-calculates the positions of the other two cursors and changes the positions of display of these two cursors. On this three-dimensional graph, the time of measurement of the data displayed thereon is also displayed in numerals, letters or symbols. The time of measurement of the data to be displayed on the graph can be changed through the input to the input device 46 to thereby change the waveforms to be displayed in the manner described above for the previous example.

Figure 5B:
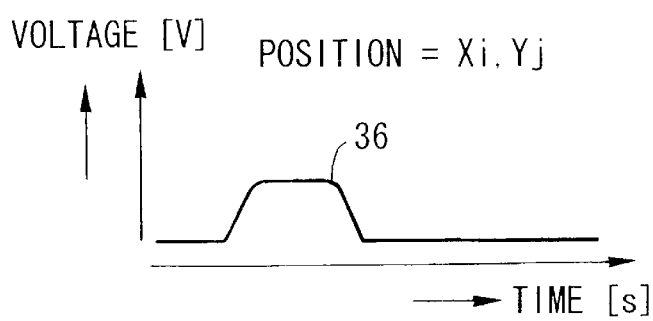
FIG. 5B is an illustration showing an example displayed in the first embodiment, wherein a two-dimensional graph representing the measuring time and the voltage at the position where the point cursor 35 shown in FIG. 5A is present is displayed.

Furthermore, it may be made possible to display a two-dimensional graph of the measurement time and the voltage (voltage change representation 36) at the position where the point cursor 35 is present as shown in FIG. 5B. In this case, the X-direction position and the Y-direction position are displayed at the same time in numerals, letters or symbols. Specifically, the voltage change representation 36 shows the change in time of the voltage at the location where the X-direction and Y-direction positions are Xi and Yi, respectively.

FIG. 6A shows an example of displaying a power distribution on the screen of the calculation/display device 15. More specifically, an effective value of the average power which has been consumed between two arbitrary points in time entered through the input device 46 is calculated for each point on the measurement plane, and the distribution of those points at which the value is greater than an arbitrary power (minimum display power) value also entered through the input device 46 is displayed on a two-dimensional graph. Since the resistance, the current and the power factor of the DUT 6 are not known in this case, these are assumed to be "1" when performing the calculation operation. Simultaneously with the display of the above two-dimensional graph, the two time instants as designated by the input to the input device 46 and the minimum display power as entered through the input device 46 are displayed in numerals, letters or symbols. Thus, a distribution of occurrences of voltage changes within the DUT 6 can be displayed in a very clear manner by displaying the distribution of those points representing power values greater than a predetermined value.

It is possible to display a first marker 37 whose position can be designated by an input through the input device 46 on the two-dimensional graph shown in FIG. 6A and to display a change in time of the voltage at the position of the first marker 37 (voltage change representation 39-1) in the form of a two-dimensional graph as shown in FIG. 6B. In this case, the position of the first marker 37 is displayed at the same time with numerals, letters or symbols.

It is also possible to display the first marker 37 and an additional second marker 38 whose positions can be designated by inputs through the input device 46 on the two-dimensional graph shown in FIG. 6A and to display a voltage distribution between these markers (voltage distribution representation 39-2) in the form of a two-dimensional graph as shown in FIG. 6C. In this case, the measurement time as inputted through the input device 46 is displayed at the same time in numerals, letters or symbols.

It is also possible to display, instead of the above-mentioned effective values of the power, the peak values.

Next, a description will be given of the procedure for determining the movement of a voltage waveform on the measurement plane and for displaying the result. The frequency components of the voltages changing over time at two arbitrary points on the measurement plane, i.e., the changes of each voltages as a function of time, are calculated at the phase analyzing circuit 30 from the measurement data recorded in the recording device 29. Specifically, the phase analyzing circuit 30 carries out a Fourier transform of the measurement values of the voltages changing over time at the two arbitrary points on the measurement plane to thereby obtain for each of the two points a real-term coefficient and an imaginary-term coefficient of the first order frequency component. When the imaginary-term coefficients are positive for both points, the phase analyzing circuit 30 determines that the voltage waveform travels from the greater real-term coefficient side to the smaller real-term coefficient side. When the imaginary-term coefficients are negative for both points, the phase analyzing circuit 30 determines that the voltage waveform travels from the smaller real-term coefficient side to the greater real-term coefficient side. When the imaginary-term coefficients are positive and negative, the phase analyzing circuit 30 determines that the voltage waveform travels from the positive imaginary-term coefficient side to the negative imaginary-term coefficient side. When either one of the imaginary-term coefficients is zero with the real-term coefficients being positive, the phase analyzing circuit 30 determines that the voltage waveform travels from the smaller imaginary-term coefficient side to the greater imaginary-term coefficient side. When either one of the imaginary-term coefficients is zero with the real-term coefficients being negative, the phase analyzing circuit 30 determines that the voltage waveform travels from the greater imaginary-term coefficient side to the smaller imaginary-term coefficient side.

The calculation/display device 15 then displays the positions of the two points and the direction of movement of the voltage waveform by means of two-dimensional graphics (not shown).

The phase analyzing circuit 30 performs the above-described determination for each point on the measurement plane. More specifically, the phase analyzing circuit 30 calculates, from the measurement data recorded in the recording device 29, frequency components of each voltage as a function of time at one of the respective points on the measurement plane. In this case, the phase analyzing circuit 30 carries out a Fourier transform of the measurement value of the voltage varying with the lapse of time at each point on the measurement plane to thereby obtain a coefficient of a real-number term and a coefficient of an imaginary-number term of the first-order frequency component at each point on the measurement plane. The phase analyzing circuit 30 then obtains matrices of the real terms and imaginary terms of the first-order frequency components at the respective points on the measurement plane as shown in FIGS. 7A and 7B, wherein FIG. 7A shows the matrix of the coefficients of the first-order real-number terms on the measurement plane while FIG. 7B shows the matrix of the coefficients of the first-order imaginary-number terms on the measurement plane.

When the imaginary-term coefficients are positive for both points of each pair of two points adjacent to each other on the measurement plane, the phase analyzing circuit 30 determines that the corresponding voltage waveform moves from the greater real-term coefficient side to the smaller real-term coefficient side. When the imaginary-term coefficients are negative for both points, the phase analyzing circuit 30 determines that the corresponding voltage waveform moves from the smaller real-term coefficient side to the greater real-term coefficient side. When the imaginary-term coefficients are positive and negative, the phase analyzing circuit 30 determines that the corresponding voltage waveform moves from the positive imaginary-term coefficient side to the negative imaginary-term coefficient side. When either one of the imaginary-term coefficients is zero with the real-term coefficients being positive, the phase analyzing circuit 30 determines that the corresponding voltage waveform moves from the smaller imaginary-term coefficient side to the greater imaginary-term coefficient side. When either one of the imaginary-term coefficients is zero with the real-term coefficients being negative, the phase analyzing circuit 30 determines that the corresponding voltage waveform moves from the greater imaginary-term coefficient side to the smaller imaginary-term coefficient side. Subsequently, the phase analyzing circuit 30 obtains a matrix of the directions of movement, obtains a matrix of power distributions on the measurement plane, multiplies the two matrices together to obtain a matrix of the movements of the voltage waveform which represents the direction and amount of movement of each voltage waveform, and obtains an average amount of movement of the waveform at arbitrary intervals.

Figure 8A:
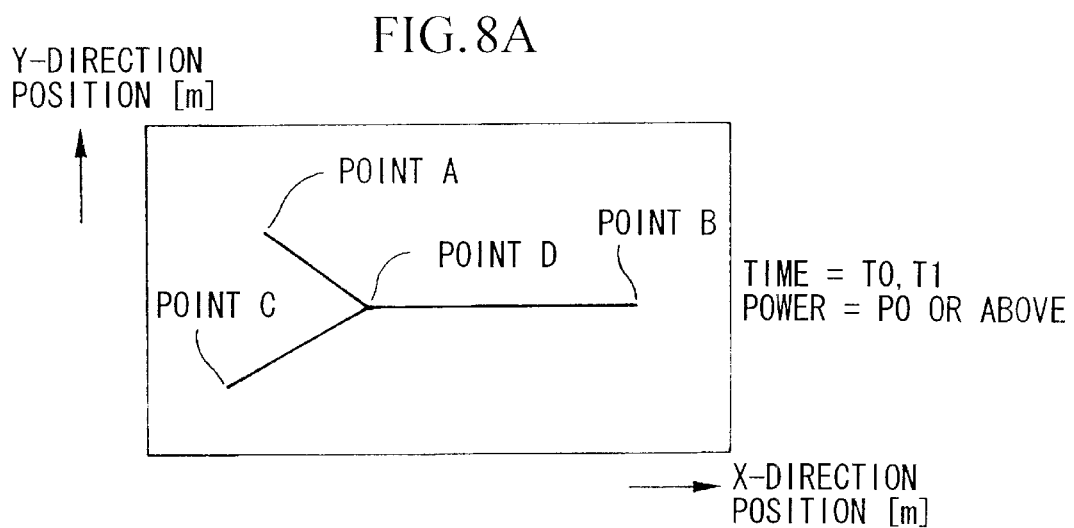
FIG. 8A is a graph showing a power distribution in the first embodiment similar to the graph shown in FIG. 6A.
Figure 8B:
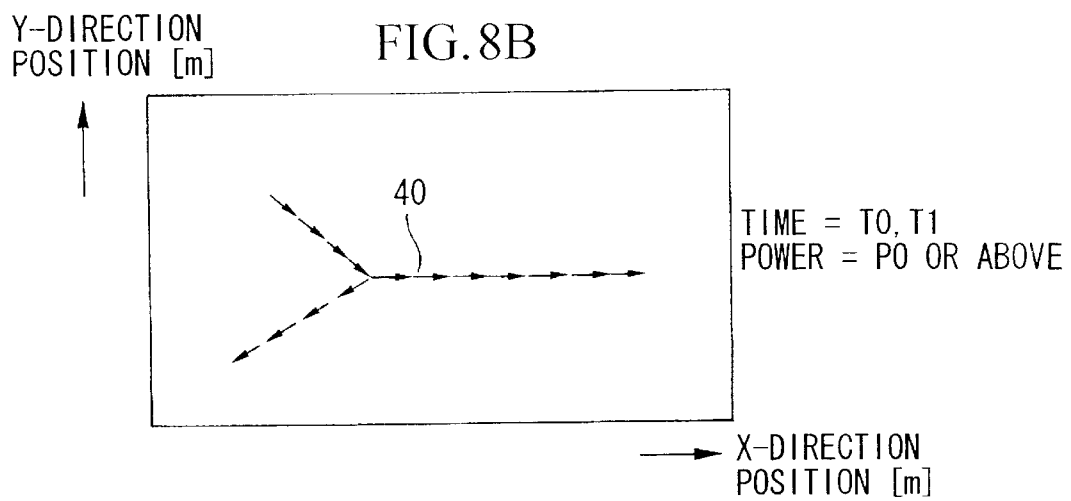
FIG. 8B is an illustration showing an example displayed in the first embodiment, wherein the direction of and the average amount of movement of the waveform for each arbitrary interval are displayed in the form of an arrow on the two-dimensional graph.
Figure 9:
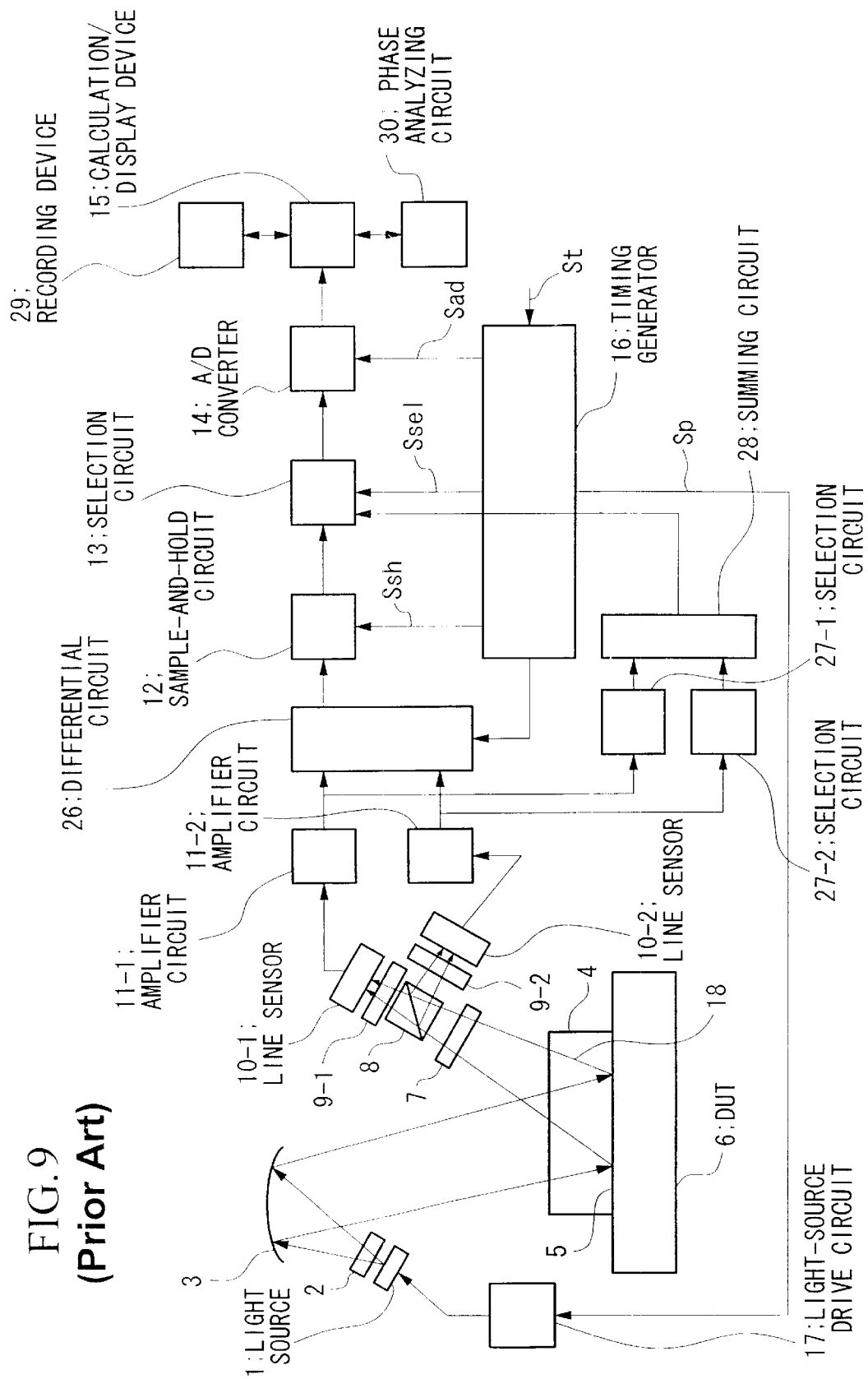
FIG. 9 is a block diagram of a semiconductor testing apparatus in the related art.
Figure 10:
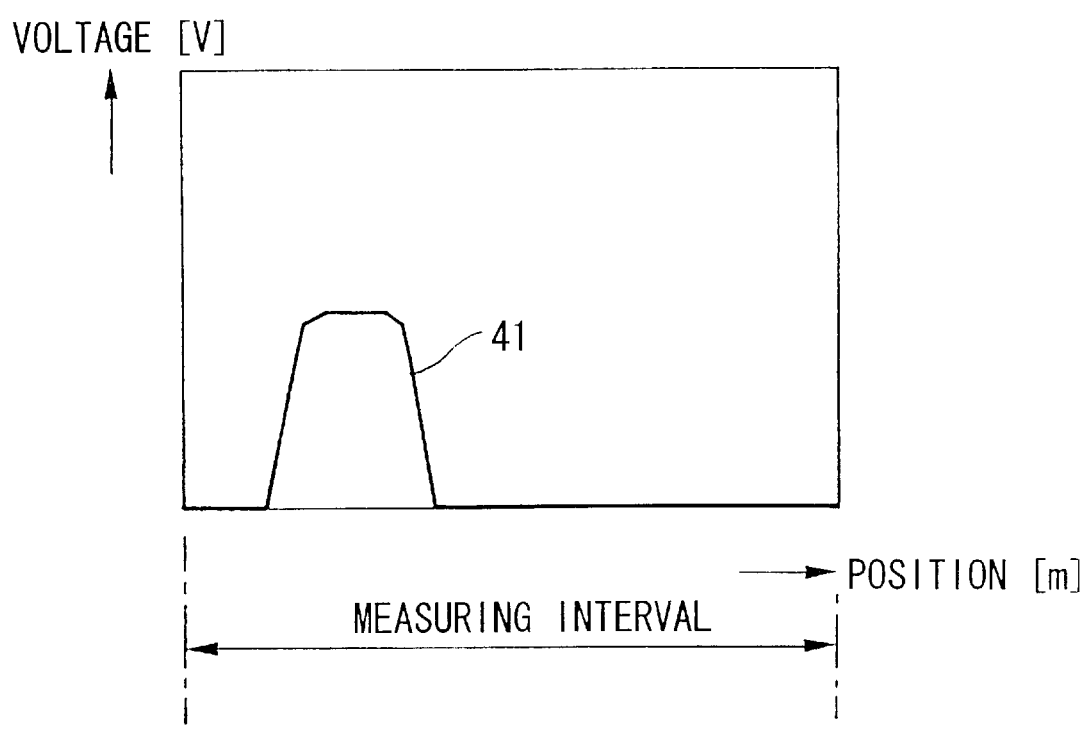
FIG. 10 is an illustration showing an example of the measurement results which the calculation/display device 15 of the related art displays.
Figure 11:
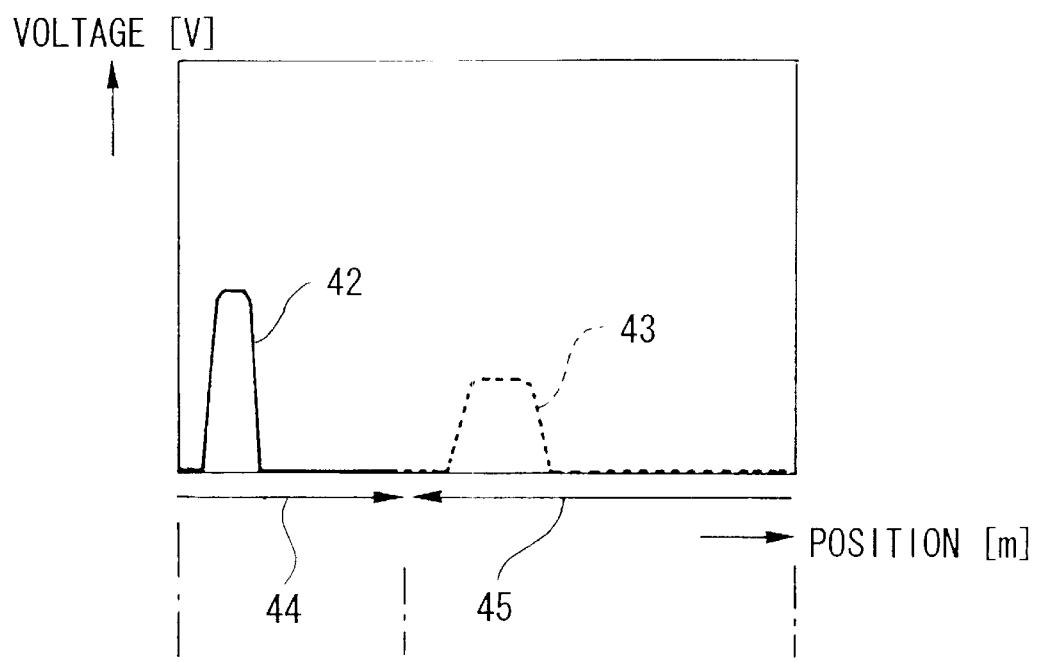
FIG. 11 is an illustration showing, as an example, the direction of traveling of the electric-field or voltage pulse displayed by the calculation/display device 15 of the related art.

The calculation/display device 15 then displays the direction and the average amount of movement of the voltage waveform in each arbitrary interval by an arrow in a two-dimensional graph as shown in FIG. 8B. The measurement time of the data is displayed at the same time in numerals, letters or symbols.

FIG. 8A is a graph showing the power distribution in a manner similar to the graph shown in FIG. 6A, and FIG. 8B is an example in which the direction of movement of the voltage waveform at each point is shown in FIG. 8A by means of arrows of micro matrices 40. From this example, it will be appreciated that there are movements of voltage waveform in the directions from point A to point D, from point D to point B and from point D to point C, in FIG. 8A and that the electric signals are traveling in these directions.

The magnitude of micro matrix 40 may be expressed by changing the thickness and/or the length and/or the color of the arrow in each arbitrary interval in accordance with the power or the peak voltage.

Alternatively, an arbitrary power or the peak voltage may be entered through the input device 46, and only those micro matrices which are greater than the entered arbitrary power or peak voltage are displayed on the calculation/display device 15.

Although the above-described embodiment was made for the case where the measurement results and/or the calculation results are displayed on the calculation/display device 15 using the measurement data recorded in the recording device 29, such measurement results and/or calculation results may alternatively be displayed on the calculation/display device 15 in real time while measuring the data.

The current distribution may alternatively be measured using a magneto-optical element in place of the electro-optical element 4 to perform the same calculations and/or displays.

What is claimed is:

1. A semiconductor testing apparatus comprising:
   a measuring section for measuring a change in time of an electric field distribution, a voltage distribution or a current distribution in a measured device, on a desired plane thereof;
   a display section for displaying a result of measurement on said desired plane of said change in time of the electric field distribution, the voltage distribution or the current distribution of said measured device; and
   an input section for entering parameters for the display of said result of measurement on said display section;
   wherein, when an arbitrary measurement time is entered through said input section as a parameter, said display section displays said result of measurement by means of a three-dimensional graph and a representation in numerals, letters or symbols of said measurement time entered through said input section, said three-dimensional graph showing along its three axes a first coordinate in a first direction on said measurement plane of said measured device, a second coordinate in a second direction which is perpendicular to said first direction on said measurement plane, and a voltage at said measurement time entered through said input section at a position on said measurement plane defined by said first and second coordinates.

2. A semiconductor testing apparatus comprising:
   a measuring section for measuring a change in time of an electric field distribution, a voltage distribution or a current distribution in a measured device, on a desired plane thereof;
   a display section for displaying a result of measurement on said desired plane of said change in time of the electric field distribution, the voltage distribution or the current distribution of said measured device; and
   an input section for entering parameters for the display of said result of measurement on said display section;
   wherein, when a first coordinate in a first direction on said measurement plane of said measured device or a second coordinate in a second direction which is perpendicular to said first direction on said measurement plane is entered through said input section as a parameter, said display section displays said result of measurement by means of a three-dimensional graph and a representation in numerals, letters or symbols of said first coordinate or said second coordinate entered through said input section, said three-dimensional graph showing along its three axes whichever of said first and second coordinates has not been entered through said input section, a measurement time, and a voltage at a position on said measurement plane defined by said first and second coordinates.

3. A semiconductor testing apparatus according to claim 1, wherein a cursor line extending along the axis representing said first coordinate, a cursor line extending along the axis representing said second coordinate or both of these cursor lines is displayed on said three-dimensional graph which said display section displays, these cursor lines being arranged to be movable by entering through said input section said first coordinate, said second coordinate or both of these coordinates.

4. A semiconductor testing apparatus according to claim 3, wherein a first two-dimensional graph taken from said three-dimensional graph along a plane including the cursor line and the axis representative of said voltage and showing along its two axes said first coordinate and a voltage at a position on a measurement line defined by said first and second coordinates, a second two-dimensional graph taken from said three-dimensional graph along a plane including the cursor line and the axis representative of said voltage and showing along its two axes said second coordinate and a voltage at a position on a measurement line defined by said first and second coordinates, or both of said first and second two-dimensional graphs, are displayed on said display section together with said three-dimensional graph, each of said two-dimensional graphs changing its appearance according to a movement of the corresponding cursor line.

5. A semiconductor testing apparatus according to claim 1, wherein, a cursor line extending along the axis representing said first coordinate and a cursor line extending along the axis representing said second coordinate are displayed on said three-dimensional graph which said display section displays, these cursor lines being arranged to be movable by entering through said input section said first coordinate, said second coordinate or both of these coordinates, a cursor point being displayed at an intersection of said cursor lines; and wherein a third two-dimensional graph, which shows along its two axes a voltage at said cursor point on said three-dimensional graph and a measurement time of this voltage, and a representation in numerals, letters or symbols of a position of said cursor point are displayed on said display section together with said three-dimensional graph, said third two-dimensional graph and said representation in numerals, letters or symbols of the position of said cursor point changing their appearance according to a movement of said cursor lines.

6. A semiconductor testing apparatus according to claim 1, wherein when two arbitrary measurement times are entered through said input section as parameters said display section displays those points on said measurement plane of said measured device at each of which a power consumed between said two measurement times is greater than a predetermined threshold valued on a fourth two-dimensional graph which shows along its two axes a first coordinate in a first direction on said measurement plane of said measured device and a second coordinate in a second direction which is perpendicular to said first coordinate on said measurement plane, said two measurement times entered through said input section and said threshold value being displayed in numerals, letters or symbols.

7. A semiconductor testing apparatus according to claim 6, wherein a plurality of markers are provided on said fourth two-dimensional graph, said display section displaying an electric field distribution, a voltage distribution or a current distribution between the markers in the form of a fifth two-dimensional graph, a measurement time of the displayed fifth two-dimensional graph being displayed in numerals, letters or symbols.

8. A semiconductor testing apparatus according to claim 1, wherein when two arbitrary measurement times are entered through said input section as parameters said display section displays those points on said measurement plane of said measured device for each of which a peak voltage between said two measurement times is greater than a predetermined threshold value on a sixth two-dimensional graph which shows along its two axes a first coordinate in a first direction on said measurement plane of said measured device and a second coordinate in a second direction which is perpendicular to said first coordinate on said measurement plane, said two measurement times entered through said input section and said threshold value being displayed in numerals, letters or symbols.

9. A semiconductor testing apparatus according to claim 7, wherein said display section displays a change in time of a voltage at a position where one of the markers is present on a seventh two-dimensional graph.

10. A semiconductor testing apparatus according to claim 1, further comprising a voltage-waveform moving direction determination section which carries out a Fourier transform of measurement results of changes in time of voltages at two arbitrary points on a desired measurement plane of said measured device, obtains a real-term coefficient and an imaginary-term coefficient of a first-order frequency component for each of said two points and determines that a voltage waveform moves from a greater real-term coefficient side to a smaller real-term coefficient side when said imaginary-term coefficients are positive for both points; from the smaller real-term coefficient side to the greater real-term coefficient side when said imaginary-term coefficients are negative for both points; from a positive imaginary-term coefficient side to a negative imaginary-term coefficient side when said imaginary-term coefficients are positive and negative; from a smaller imaginary-term coefficient side to a greater imaginary-term coefficient side when either one of said imaginary-term coefficients is zero with said real-term coefficients being positive; and from the greater imaginary-term coefficient side to the smaller imaginary-term coefficient side when either one of said imaginary-term coefficients is zero with said real-term coefficients being negative.

11. A semiconductor testing apparatus according to claim 1, further comprising a voltage waveform movement matrix calculation section which carries out a Fourier transform of measurement results of change over time of voltages at a plurality of points on a desired measurement plane of said measured device, obtains matrices of real-term coefficients and imaginary-term coefficients to first-order frequency components at a plurality of points on said measurement plane, and determines for each pair of two adjoining points of the points in each matrix that a voltage waveform moves from a greater real-term coefficient side to a smaller real-term coefficient side when said imaginary-term coefficients are positive for the two points; from the smaller real-term coefficient side to the greater real-term coefficient side when said imaginary-term coefficients are negative for the two points; from a positive imaginary-term coefficient said to a negative imaginary-term coefficient side when said imaginary-term coefficients are positive and negative; from a smaller imaginary-term coefficient side to a grater imaginary-term coefficient side when either one of said imaginary-term coefficients is zero with said real-term coefficients being positive; and from the greater imaginary-term coefficient side to the smaller imaginary-term coefficient side when either of said imaginary-term coefficients is zero with said real-term coefficients being negative; said imaginary-term coefficients is zero with said real-term coefficients being negative; said voltage-waveform movement matrix of directions of movement of the voltage waveforms, a matrix of power distributions on said measurement plane, a matrix representative of directions and amounts of movement of the voltage waveforms by multiplying the last-mentioned two matrices, and a direction and an average amount of movement of the voltage waveform in an arbitrary interval, said display section displaying an eighth two-dimensional graph, which shows a direction of movement of the voltage waveform in each arbitrary interval by means of an arrow, and a representation of said measurement time in numerals, letters or symbols.

12. A semiconductor testing apparatus according to claim 11, wherein said eighth two-dimensional graph displayed by said display section shows an amount of movement of the voltage waveform in each arbitrary interval based on a change in thickness, length or color of said arrow.

13. A semiconductor testing apparatus according to claim 11, wherein said display section displays on said eighth two-dimensional graph said arrow only for each of those intervals in which the amount of movement of the voltage waveform is greater than a predetermined threshold value, said display section further displays said threshold value in numerals, letters or symbols.

14. A semiconductor testing apparatus according to claim 1, wherein said measuring section shapes a light emitted from a light source into a linear light beam; makes the light beam incident on a desired measurement line of said measured device through an electro-optical element or a magneto-optical element disposed on said measured device; calculates an electric field distribution, a voltage distribution or a current distribution in said desired measurement line of said measured device by electrically detecting a change in polarization of a reflected beam of said light beam incident on said measurement line; calculates an electric field distribution, a voltage distribution or a current distribution on a desired measurement plane of said measured device by repeating the calculation of the electric field distribution, the voltage distribution or the current distribution on said measurement line while sweeping said measurement line in a direction perpendicular thereto; and measures a change in time of the electric field distribution, the voltage distribution or the current distribution on said desired measurement plane of said measured device by repeating the calculation of the electric field distribution, the voltage distribution or the current distribution on said measurement plane at a predetermined time interval.

* * * * *